(12) United States Patent
Shrekenhamer et al.

(10) Patent No.: US 11,522,128 B2
(45) Date of Patent: Dec. 6, 2022

(54) METASURFACE PHASE CHANGE COMMUNICATOR

(71) Applicant: The Johns Hopkins University, Baltimore, MD (US)

(72) Inventors: David B. Shrekenhamer, Bethesda, MD (US); Jeffrey P. Maranchi, Clarksburg, MD (US); Joseph A. Miragliotta, Ellicott City, MD (US); Keith S. Caruso, Catonsville, MD (US)

(73) Assignee: The Johns Hopkins University, Baltimore, MD (US)

( * ) Notice: Subject to any disclaimer, the term of this patent is extended or adjusted under 35 U.S.C. 154(b) by 950 days.

(21) Appl. No.: 16/290,077

(22) Filed: Mar. 1, 2019

(65) Prior Publication Data

US 2020/0274245 A1 Aug. 27, 2020

Related U.S. Application Data

(60) Provisional application No. 62/637,426, filed on Mar. 2, 2018.

(51) Int. Cl.
*H01L 45/00* (2006.01)
*G02F 1/00* (2006.01)
*H01L 23/34* (2006.01)

(52) U.S. Cl.
CPC ............ *H01L 45/06* (2013.01); *G02F 1/0054* (2013.01); *H01L 23/34* (2013.01);
(Continued)

(58) Field of Classification Search
CPC ......... H01L 45/02; H01L 45/04; H01L 45/06; H01L 45/065; H01L 45/1213; H01L 45/1233; H01L 45/1253; H01L 45/126; H01L 45/14; H01L 45/141; H01L 45/143; H01L 45/144; H01L 33/26; H01L 33/28; H01L 33/34; H01L 33/36; H01L 33/38;
(Continued)

(56) References Cited

U.S. PATENT DOCUMENTS 7,723,715 B2 * 5/2010 Czubatyj ............... H01L 45/148
257/E39.019
8,045,369 B2 * 10/2011 Kato ................... G11C 13/0004
365/163

(Continued)

*Primary Examiner* — Eduardo A Rodela
(74) *Attorney, Agent, or Firm* — Noah J. Hayward

(57) ABSTRACT

A metasurface unit cell for use in constructing a metasurface array is provided. The unit cell may include a ground plane layer comprising a first conductive material, and a phase change material layer operably coupled to the ground plane layer. The phase change material layer may include a phase change material configured to transition between an amorphous phase and a crystalline phase in response to a stimulus. The unit cell may further include a patterned element disposed adjacent to the phase change material layer and includes a second conductive material. In response to the phase change material transitioning from a first phase to a second phase, the metasurface unit cell may resonate to generate an electromagnetic signal having a defined wavelength. The first phase may be the amorphous phase or the crystalline phase and the second phase may be the other of the amorphous phase or the crystalline phase.

20 Claims, 5 Drawing Sheets

(52) U.S. Cl.
CPC ........ *H01L 45/1286* (2013.01); *H01L 45/141* (2013.01); *H01L 45/144* (2013.01); *G02F 2202/08* (2013.01); *G02F 2202/30* (2013.01); *G02F 2203/12* (2013.01); *G02F 2203/13* (2013.01); *G02F 2203/15* (2013.01)

(58) Field of Classification Search
CPC . H01L 33/387; H01L 25/075; H01L 25/0753; H01L 25/16; H01L 25/167; H01L 23/34; H01L 45/1286; G02B 1/002; G02B 26/06; G02F 1/0054; G02F 2203/12; G02F 2203/13; G02F 2203/15; H01Q 15/0086
See application file for complete search history.

(56) References Cited

U.S. PATENT DOCUMENTS

| | | | |
|---|---|---|---|
| 9,368,720 B1* | 6/2016 | Moon | H01L 45/16 |
| 10,437,083 B1* | 10/2019 | Baleine | G02F 1/0054 |
| 10,725,323 B2* | 7/2020 | Bhaskaran | G02F 1/0147 |
| 11,187,891 B1* | 11/2021 | Moon | G02F 1/133553 |
| 2009/0257113 A1* | 10/2009 | Smith | G02B 26/001 |
| | | | 528/30 |
| 2010/0225989 A1* | 9/2010 | Anders | G02F 1/19 |
| | | | 359/288 |
| 2017/0221596 A1* | 8/2017 | Caldwell | G01J 5/0896 |
| 2018/0045861 A1* | 2/2018 | Caldwell | H01L 37/02 |
| 2019/0198820 A1* | 6/2019 | Ko | H01L 27/3225 |

* cited by examiner

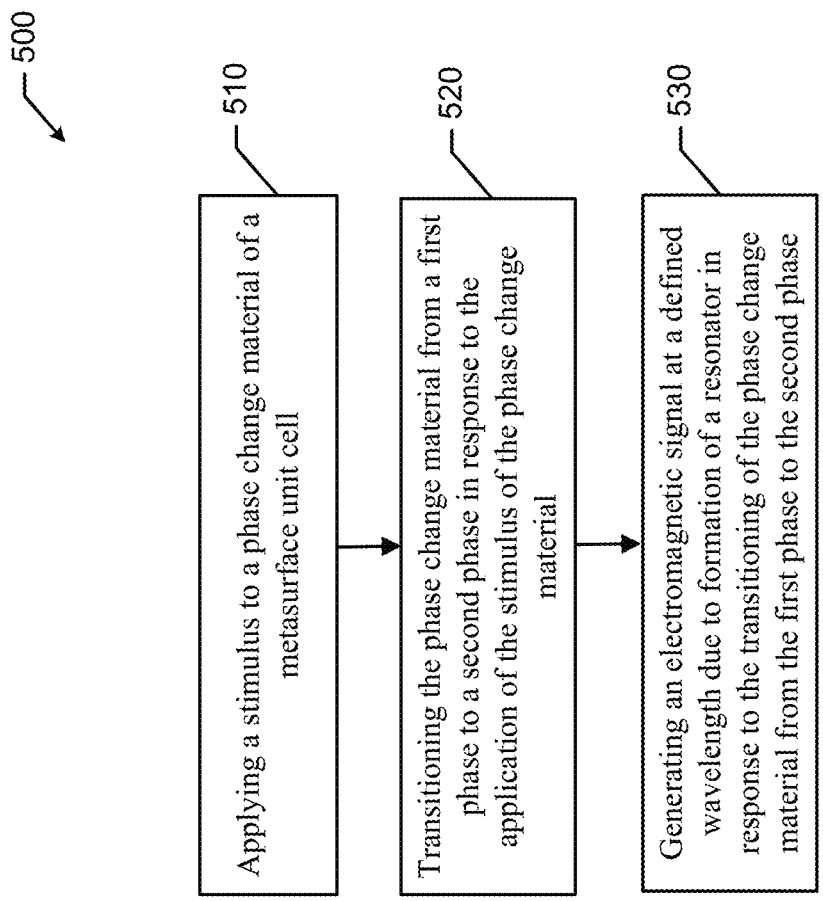

METASURFACE PHASE CHANGE COMMUNICATOR

CROSS REFERENCE TO RELATED APPLICATIONS

This application claims priority to and the benefit of U.S. Provisional Application Ser. No. 62/637,426 filed on Mar. 2, 2018, the entire contents of which are incorporated herein by reference.

STATEMENT OF GOVERNMENTAL INTEREST

This invention was made with Government support under contract number N6833518C0659 awarded by the Office of Naval Research (ONR). The Government has certain rights in the invention.

TECHNICAL FIELD

Example embodiments generally relate to communications technology and, in particular, relate to metamaterials that are configured to support communications applications.

BACKGROUND

Innovation in the area of metamaterials continues to accelerate with new properties and associated applications being developed. Metamaterials, which are engineered materials that exhibit properties not found in naturally occurring materials, typically are constructed of constituent components that can be repeated to form a sheet, or a metasurface. Such metamaterials are often developed to have properties that generate or affect electromagnetic fields. In this regard, some metamaterials have been designed to block, absorb, enhance, or even bend electromagnetic waves. As such, metamaterials can offer solutions and achieve benefits that were simply unavailable through the use of conventional materials. While numerous metamaterials and associated metasurface structures and applications have been developed, there continues to be a need in the area of leveraging metamaterials to support wireless communications.

BRIEF SUMMARY OF SOME EXAMPLES

According to some example embodiments, a metasurface unit cell is provided. The metasurface unit cell may comprise a ground plane layer comprising a first conductive material, and a phase change material layer operably coupled to the ground plane layer. The phase change material layer may comprise a phase change material configured to transition between an amorphous phase and a crystalline phase in response to a stimulus. The metasurface unit cell may further comprise a patterned element disposed adjacent to the phase change material layer, where the patterned element comprises a second conductive material. In response to the phase change material transitioning from a first phase to a second phase, the metasurface unit cell may resonate to generate an electromagnetic signal comprising a defined wavelength. In this regard, the first phase may be the amorphous phase or the crystalline phase and the second phase may be the other of the amorphous phase or the crystalline phase. Further, in response to the phase change material being in the first phase, the metasurface unit cell may not resonate to generate the electromagnetic signal comprising the defined wavelength.

According to some example embodiments, a metasurface array is provided. The metasurface array may comprise a ground plane layer comprising a first conductive material, and a phase change material layer operably coupled to the ground plane layer. In this regard, the phase change material layer may comprise a phase change material configured to transition between an amorphous phase and a crystalline phase in response to a stimulus. The metasurface array may further comprise a plurality of first patterned elements disposed adjacent to the phase change material layer. In this regard, the first patterned elements may have a first layout. Further, a plurality of second patterned elements may be disposed adjacent to the phase change material layer, and the second patterned elements having a second layout. In response to the phase change material adjacent the first patterned elements transitioning from a first phase to a second phase, the first patterned elements may contribute to formation of a first resonator to generate a first electromagnetic signal comprising a first defined wavelength. In response to the phase change material adjacent the second patterned elements transitioning from a third phase to a fourth phase, the second patterned elements contribute to formation of a second resonator to generate a second electromagnetic signal comprising a second defined wavelength. In this regard, the first phase may be the amorphous phase or the crystalline phase and the second phase may be the other of the amorphous phase or the crystalline phase to the first phase. Similarly, the third phase may be the amorphous phase or the crystalline phase and the fourth phase may be the other of the amorphous phase or the crystalline phase to the third phase.

Further, according to some example embodiments, a method is provided. The example method may comprise applying a stimulus to a phase change material of a metasurface unit cell, and transitioning the phase change material from a first phase to a second phase in response to the application of the stimulus of the phase change material. In this regard, the first phase may be an amorphous phase or a crystalline phase and the second phase may be the other of the amorphous phase or the crystalline phase. The example method may further comprise generating an electromagnetic signal at a defined wavelength due to formation of a resonator in response to the transitioning of the phase change material from the first phase to the second phase. In this regard, the resonator may comprise a patterned element and the phase change material. Further, the metasurface unit cell may comprise the patterned element, the phase change material, and a ground plane layer, wherein the patterned element is disposed adjacent to the phase change material, and the phase change material is operably coupled to the ground plane layer.

BRIEF DESCRIPTION OF THE SEVERAL VIEWS OF THE DRAWING(S)

Having thus described some example embodiments in general terms, reference will now be made to the accompanying drawings, which are not necessarily drawn to scale, and wherein:

FIG. 5 illustrates a flowchart of an example method of operation of a unit cell of a metasurface communicator according to some example embodiments.

DETAILED DESCRIPTION

Figure 1:
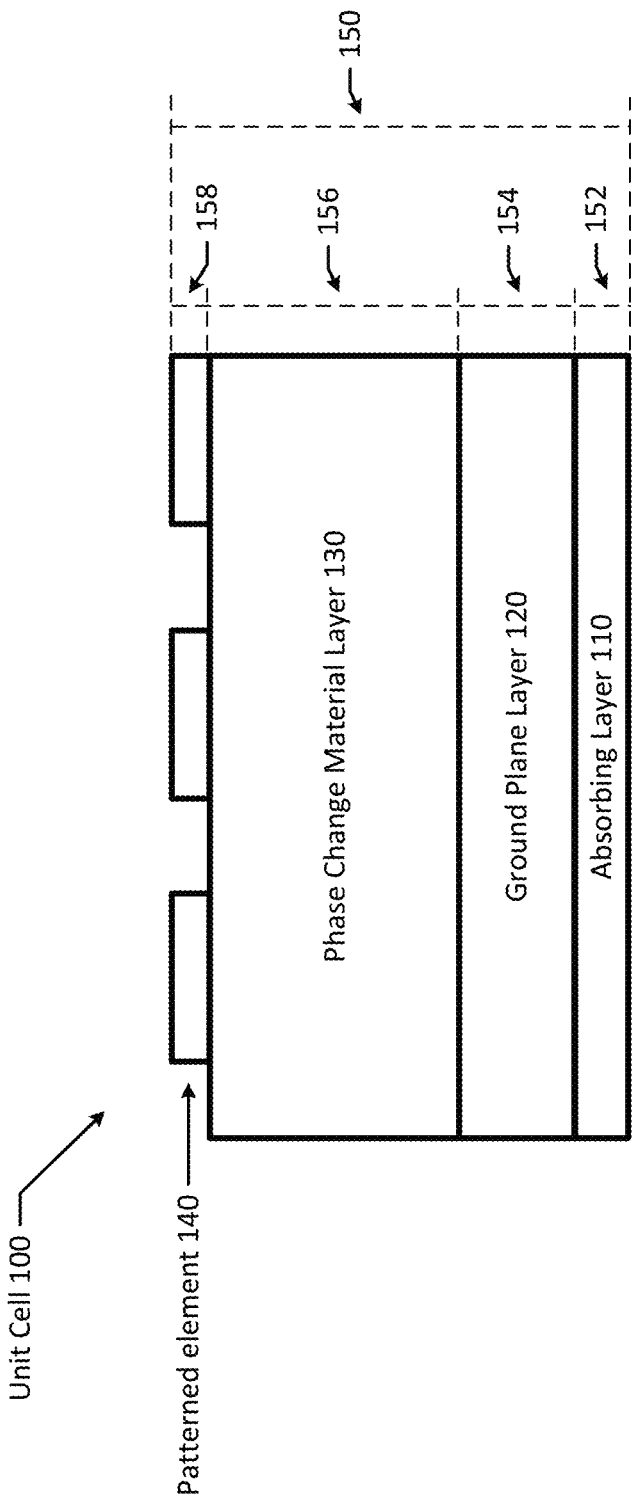
FIG. 1 illustrates a unit cell of a metasurface communicator according to some example embodiments.

Some example embodiments now will be described more fully hereinafter with reference to the accompanying drawings, in which some, but not all example embodiments are shown. Indeed, the examples described and pictured herein should not be construed as being limiting as to the scope, applicability or configuration of the present disclosure. Rather, these example embodiments are provided so that this disclosure will satisfy applicable legal requirements. Like reference numerals refer to like elements throughout. As used herein, operable coupling should be understood to relate to direct or indirect connection that, in either case, enables functional interconnection of components that are operably coupled to each other.

According to various example embodiments, a phase change material may be used to construct a metasurface phase change communicator with a controllable resonator for use in wireless communications. In this regard, according to some example embodiments, a metasurface array, having, for example, a sub-micron thickness, may be a component of a metasurface phase change communicator, and the metasurface array may be constructed of a number of fundamental building blocks in the form of unit cells. Each unit cell may be comprised of a stack of materials including a ground plane layer, a phase change material layer, and a patterned element. The patterned element, the phase change material layer, and the ground plane layer may operate together to form a resonant circuit or resonator that may resonate and generate an electromagnetic signal as an output signal. As further described below, the resonator may be formed as a result of the interaction between the patterned element, which may comprise a conductive or dielectric material, and the ground plane layer with the phase change material layer being a dynamically controllable dielectric that is, according to some example embodiments, disposed between the patterned element and the ground plane layer. Alternatively, in some example embodiments, the patterned element may be disposed between the phase change material layer and the ground plane layer. The operation of the resonator of the unit cell may be controlled by controlling the phase of the phase change material in the phase change material layer, which may be, for example, a chalcogenide glass such as germanium-antimony-tellurium (GST) or germanium telluride (GeTe). In this regard, the phase change material may be configured to transition between an amorphous phase and a crystalline phase in response to a stimulus, such as a temperature change. As such, a stimulation device, such as a laser generating device, may apply an optical signal to the unit cell to change the temperature of the phase change material and control the phase of the material. Since the phase change material layer may be configured to operate as a dielectric spacer between the patterned element and the ground plane layer, the dielectric characteristics of the phase change material may be affected by the operation of the resonator.

In this regard, the phase change material may have different dielectric values depending on a current phase of the phase change material. According to some example embodiments, resonance may occur in response to the phase change material exhibiting a first dielectric value or a second dielectric value. The different dielectric values may correspond to the changes in the reflectance and emissivity of the unit cell in response to the phase change of the phase change material. For example, when the phase change material is in an amorphous phase, the phase change material layer may have a first dielectric value, and when the phase change material is in a crystalline phase, the phase change material may have second dielectric value. According to some example embodiments, either phase may be used to form a resonant circuit or resonator based on the design. In this regard, for example, for the resonator of the unit cell to operate to generate the output signal, a phase change material layer operating as a dielectric spacer with the first or second dielectric value may be used. The phase change material may operate as the dielectric spacer with a dielectric value that is, for example, the first or second dielectric value when the phase change material is in the amorphous phase or crystalline phase, respectively.

Additionally, according to some example embodiments two different modes of operation may be available for the unit cell or a metasurface constructed using the unit cell. The modes of operation may be active and passive. For a passive communication, a characteristic of a resonant self-emission may be modulated, without the need for any direct illumination. Such a passive communication solution may modulate between a high absorption/high emissive state and a high reflectance/low emissivity state. Alternatively, in the active mode, a blackbody, laser, or other optical device may illuminate a surface of the unit cell thereby allowing modulation of the incident light through a combination of modifying the light intensity, phase, direction, or polarization.

As such, by controlling, for example, the temperature of the phase change material via a stimulus medium from a stimulus device, spectral, spatial, temporal, and polarization control of the unit cell may occur to selectively form a resonator and control resonator to encode data on an output signal of the resonator. Spectral control may involve modifications of the wavelength behavior at select bands, e.g., changes in the amplitude or phase reflection/transmission/absorption that may result from a shift in a wavelength or pure amplitude modulation. Spatial modulation may, for example, occur through control by pixilation or some other scheme to locally modify the spectral properties across the active area of the unit cell or, more appropriately, a metasurface. Temporal control may relate to the modulation bandwidth of the output signal of the unit cell or metasurface and an ability to dynamically modulate or reconfigure the surface of the unit cell a metasurface as a function of time. Polarization control may be exhibited through select modulation at distinct polarization states, e.g., linear or circular, which can also generate polarization changes such as between a mirror surface and a quarter or half-waveplate. Additionally, the stimulus device, such as a laser generating device, may be controlled by control circuitry to selectively emit the laser to warm or cool the phase change material in accordance with a bit sequence to be encoded. With a high-speed stimulus device associated data rates may be obtained and mesoscopic control of the local permeability and permittivity may be permitted.

Based on the foregoing and as otherwise described herein, a wavelength of the output signal may be selected based on the design parameters of the resonator. In this regard, according to some example embodiments, the desired wavelength for the formed resonator, may be in the mid-wavelength infrared (MWIR) band or the long-wavelength infrared (LWIR) band.

In this regard, FIG. 1 illustrates a unit cell 100 of a metasurface communicator according to some example embodiments. The unit cell 100 may be a fundamental building block of a metasurface array or a metasurface communicator. As further described below, a plurality of unit cells 100 may be included to form one or more pixels of a metasurface array. In this regard, a unit cell 100 may include a ground plane layer 120, a phase change material layer 130, and a patterned element 140. According to some example embodiments, the unit cell 100 may also include an absorbing layer 110. The unit cell 100 may have a unit cell thickness 150 that may be, for example, less than one micrometer. According to some example embodiments, the unit cell thickness 150 may be defined by the aggregate of the absorbing layer thickness 152, the ground plane layer thickness 154, the phase change material layer thickness 156, and the patterned element 140.

According to some example embodiments, the absorbing layer 110 may be formed at a bottom of the stack of component layers that make up the unit cell 100. The absorbing layer 110 may comprise a material that has a low thermal mass and high optical absorption at a desired wavelength (e.g., the wavelength of an input signal such as a laser from the stimulus device 160 of FIG. 2). Further, according to some example embodiments, the absorbing layer 110 may be configured to sustain high temperatures without failure. As further described below, according to some example embodiments, the absorbing layer 110 may be formed as a continuous sheet that extends to adjacent unit cells 100 in a metasurface array. The absorbing layer 110 may receive, for example, a signal (e.g., an optical, electronic or thermal signal) that may increase a temperature of the absorbing layer 110. Due to the material or materials used to form the absorbing layer 110, the absorbing layer 110 may operate to absorb and distribute the received thermal energy across a surface area and volume of the absorbing layer 110. As such, the absorbing layer 110 may be configured to reduce or limit thermal hot spot locations that may determinately impact the operational characteristic of additional layers within the unit cell 100. Further, the absorbing layer 110 may also limit or block, for example, the passage of optical signals (e.g., high intensity light) from reaching other layers of the unit cell 100 (e.g., round plane layer 120, phase change material layer 130, or the like), thereby avoiding possible damage to those layers. The absorbing layer 110 may have an absorbing layer thickness 152.

A ground plane layer 120 may be disposed, according to some example embodiments, on and above the absorbing layer 120. The ground plane layer 120 may comprise a conductive material, such as, for example, refractory metals such as tungsten or molybdenum. As further described below, the ground plane layer 120 may be configured to operate with the patterned element 140 and the phase change material layer 130 to form a resonant or resonant circuit that generates an electromagnetic signal. Like the absorbing layer 110, the ground plane layer 120, according to some example embodiments, may be formed as a continuous sheet that extends to adjacent unit cells 100 in a metasurface array. The ground plane layer 110 may be electrically isolated from the patterned element 140 by the phase change material layer 130. Further, the ground plane layer 120 may have a ground plane layer thickness 154.

The phase change material layer 130 may be disposed, according to some example embodiments, on and above the ground plane layer 120. As mentioned above, the phase change material layer 130 may include phase change material configured to transition between an amorphous phase and a crystalline phase in response to a stimulus. In this regard, the phase change material may have differing dielectric characteristics depending on whether the phase change material is in the amorphous phase or the crystalline phase. In other words, based on the material and the phase change material layer thickness 156, when the phase change material is in the amorphous phase, the phase change material may have a first dielectric value, and when the phase change material is in the crystalline phase, the phase change material may have a second dielectric value. As further described below, the phase change material of the phase change material layer 130 may be caused to transition between the amorphous phase and the crystalline phase in response to a stimulus, such as, for example, a change in temperature. As such, the phase change material layer thickness 156 may be a design parameter that may be selected to achieve a desired resonant circuit, as further described below. According to some example embodiments, the phase change material of the phase change material layer 130 may be, for example, chalcogenide glass. Like the absorbing layer 110 and the ground plane layer 120, the phase change material layer 130, according to some example embodiments, may be formed as a continuous sheet that extends to adjacent unit cells 100 in a metasurface array.

The unit cell 100 may also include a patterned element 140 that, according to some example embodiments, may be disposed above and on the phase change material layer 130. Alternatively, according to some example embodiments, the patterned element 140 may be disposed between the phase change material layer 130 and the ground plane layer 120. Accordingly, the patterned element 140 may be disposed adjacent the phase change material layer 130. The patterned element 140 may comprise a conductive or dielectric material that is formed into a desired layout, shape, or architecture. In this regard, the layout of the patterned element 140 may be selected to achieve a desired output signal wavelength for a particular application, as further described below. Each unit cell 100 may comprise one patterned element 140. As such, the patterned element 140 may define a top area (or footprint) of the unit cell 100 (i.e., a length and width) that, together with thickness 150, defines a volume of the unit cell 100. In this regard, according to some example embodiments, the stimulus used to cause the phase change material to perform a phase change, may be applied to the unit cell 100 based on the top area of the unit cell 100 as defined by the patterned element 140. Additionally, the patterned element 140 may have a patterned element thickness 158.

Further, according to some example embodiments, additional layers may be included as components of the unit cell 100. For example, according to some example embodiments, one or more layers may be added to increase the spacing between the phase change material layer 130 or the patterned element 140 and the ground plane layer 120. Such, additional layers may be, for example, dielectric layers (e.g., layers including material that have a static dielectric characteristic). Additionally, according to some example embodiments, a passivation layer that may disposed on top of the unit cell 100 may be included. Such passivation layer may be formed, for example, as a thin dielectric coating that is disposed on the patterned element 140.

Figure 2:
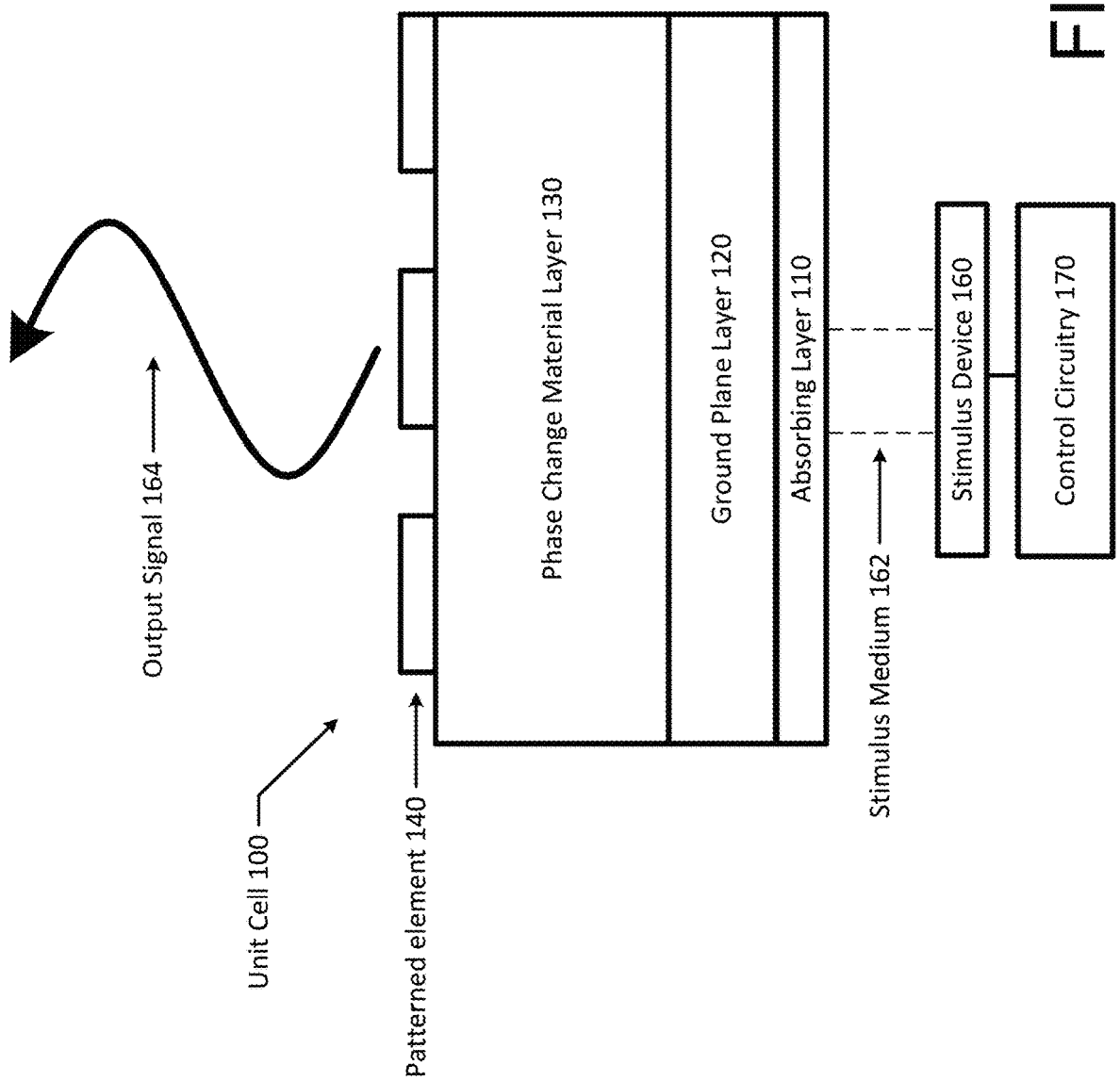
FIG. 2 illustrates a unit cell of a metasurface communicator interfaced with a stimulus device to facilitate communications according to some example embodiments according to some example embodiments.

FIG. 2 illustrates a unit cell of a metasurface communicator interfaced with a stimulus device 160 to facilitate transmission of an output signal 164 according to some example embodiments. In this regard, the system of FIG. 2 comprises the unit cell 100 (as described above) operably coupled to a stimulus device 160 via a stimulus medium 162. As described further below, the stimulus device 160 may be controlled by control circuitry 170.

Design parameters of the unit cell 100 may be selected such that the unit cell 100 forms a resonant circuit or resonator when the phase change material of the phase change material layer 130 is in a desired phase. In this regard, for the phase example, the layout of the patterned element 140, the material used for the phase change material, and thickness 156 of phase change material layer 130 may be selected such that the unit cell 100 forms a resonator to generate an output signal 164 in the form of an electromagnetic signal, when the phase change material is in, for example, the amorphous phase or the crystalline phase, depending on the design of the unit cell 100. According to some example embodiments, the output signal 164 may have a desired wavelength based on the resonance frequency of the formed resonator. In this regard, according to some example embodiments, an output signal 164 with a first desired wavelength may be generated when the phase change material is in the amorphous phase and a different output signal 164 with a second desired wavelength may be generated when the phase change material is in the crystalline phase. As such, transitioning between phases, according to some example embodiments, may result in a shift in wavelength due to the dielectric values for the phase change material in the different phases. According to some example embodiments, the desired wavelength may be in the mid-wavelength infrared (MWIR) band (i.e., a wavelength between about 3 to 8 micrometers) or in the long-wavelength infrared (LWIR) band (i.e., a wavelength between about 8 to 15 micrometers). Further, in another example embodiment, the desired wavelength may be between about 800 nanometers to 3 micrometers. Thus, according to some example embodiments, the desired wavelength may be between about 800 nanometers to 15 micrometers. As such, according to some example embodiments, the unit cell thickness 150 may be less than the wavelength of the output signal 164. Further, according to some example embodiments, the thickness 156 of the phase change material layer 130 may be more than 200 times less than the desired wavelength. This relationship of the thicknesses may be the result of localized fields of the patterned layer resonance, which may significantly enhance the light matter interactions with any surrounding phase change material, thus allowing for significant decrease in the necessary volume and thickness to generate modification in the electromagnetic response. The reduction in volume significantly reduces the energy needed to transition the phase of the phase change material.

The stimulus device 160 may be capable of causing the phase change material of the phase change material layer 130 to transition between the amorphous phase and the crystalline phase (or variations therebetween). In this regard, the stimulus device 160 may be configured to output a thermal signal as the stimulus medium 162 to change a temperature of the phase change material (via, for example, conduction through the ground plane layer 120 and the absorbing layer 110 to the phase change material layer 130). In this regard, the thermal signal may be received by the absorbing layer 110, as mentioned above, which may be configured to more evenly distribute, for example, heat across an area of the absorbing layer 110 associated with the unit cell 100. The energy, in the form of heat, may be conducted through the ground plane layer 120 to the phase change material layer 130 such that the temperature of the phase change material can be affected. When the temperature of the phase change material reaches, for example, a threshold temperature, a phase change may occur. In this regard, for example, the phase change material may transition from an amorphous phase to a crystalline phase, or from a crystalline phase to an amorphous phase.

Alternatively, the stimulus device 160 may be configured to output an optical signal as the stimulus medium 162 to change the temperature of the phase change material in a similar manner as described above. In this regard, for optical control, optical energy may be absorbed into the unit cell 100. To do so, for example, the optical signal may be received by the absorbing layer 110 and may be converted into thermal energy that may be conducted to the phase change material of the phase change material layer 130 as described above to cause a phase change. According to some example embodiments, the stimulus device may be a vertical cavity surface emitting laser (VCSEL) or other high power optical source configured to output an optical signal as the stimulus medium 162. Alternatively, the stimulus device 160 may be configured to output an electrical signal as the stimulus medium 162 to change the temperature of the phase change material in a similar manner as described above. In this regard, an electrical signal may be operate to form a microheater via, for example, the absorbing layer, or by providing the signal directly into, for example, the phase change material layer 130 through integration with the architecture of the unit cell 100. According to some example embodiments, the electrical signal may be connected directly to the phase change material layer to cause the temperature of the phase change material to change via, for example, resistive heating. The thermal energy may be received by the phase change material of the phase change material layer 130 as described above to cause a phase change.

As such, by controlling the stimulus medium 162, the phase of the phase change material may be controlled, which in turn operates to control the operation of the resonant circuit or resonator that generates the output signal 164. Through control of the resonant circuit (i.e., by starting and stopping the resonant condition) data may be encoded into the output signal 164. Accordingly, the control circuitry 170 may be configured to control the output of the stimulus device 160 to encode data onto the output signal 164 for transmission as a wireless communication. In this regard, the control circuitry 170 may be configured to cause the stimulus device 160 to operate at high speeds to heat or cool the phase change material of the phase change material layer 130 and rapidly cause changes in phase to encode data onto the output signal 164. According to some example embodiments, the control circuitry 170 may include an input that receives data that is to be encoded into the output signal 164.

The control circuitry 170 may be hardware or software configured to control the stimulus device 160. As a hardware configured component (or collection of components) the control circuitry 170 may include an application specific integrated circuit (ASIC) or a field programmable gate array (FPGA) that is specifically configured to control the stimulus device 160 and cause the unit cell 100 to generate the output signal 164 as a wireless communication signal at the desired wavelength. Additionally, or alternatively, as a software configured component (or collection of components), the control circuitry 170 may include a processor and a memory where the instructions to be executed by the processor may be stored on the memory.

Figure 3:
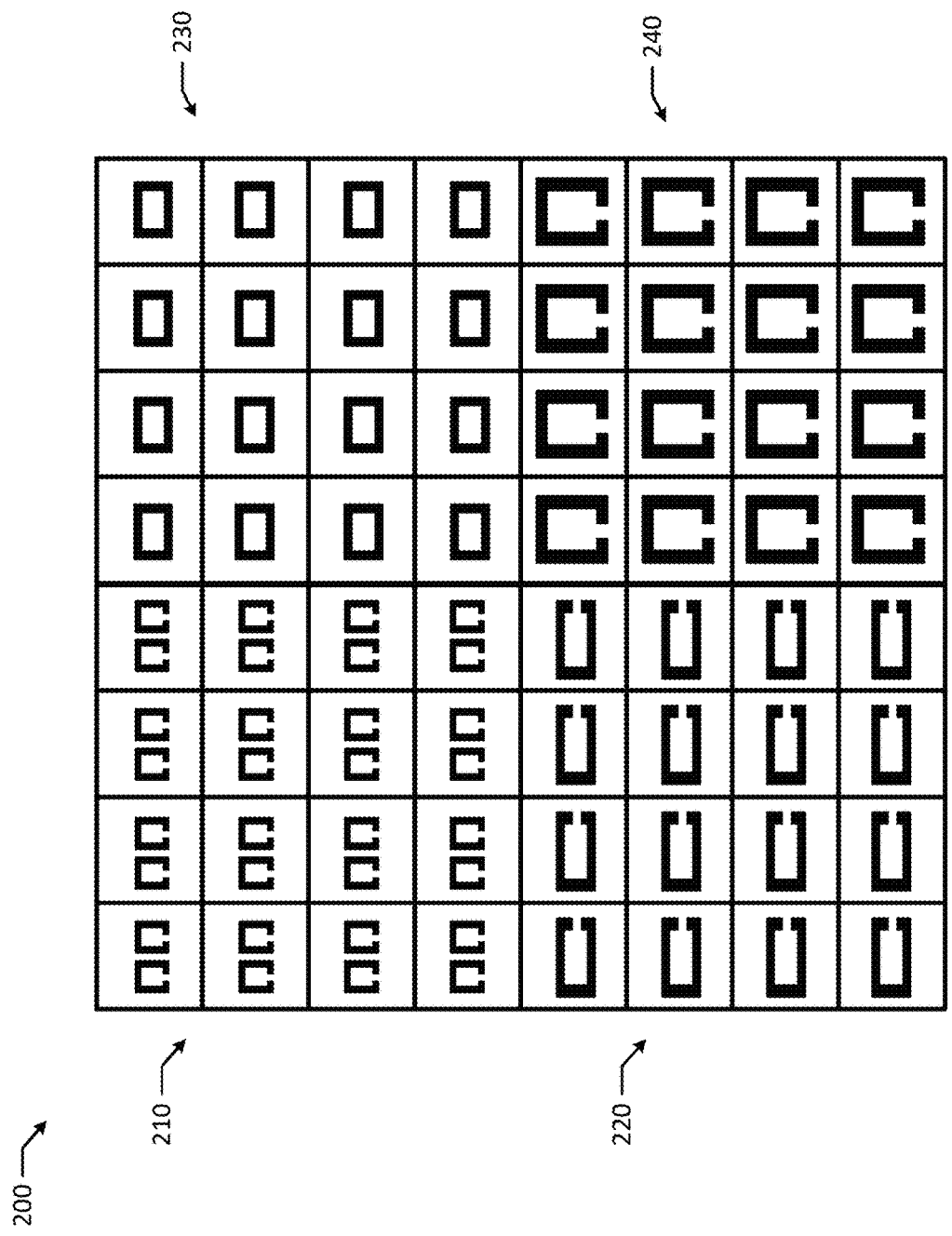
FIG. 3 illustrates a metasurface array according to some example embodiments according to some example embodiments.

FIG. 3 illustrates a metasurface array 200 according to some example embodiments. In this regard, FIG. 3 illustrates a top view of a metasurface array 200 that comprises a plurality of unit cells that may be constructed and controlled in the same or similar manner as unit cell 100 described above.

According to some example embodiments, a group of unit cells having patterned elements of the same architecture or layout may be referred to as a pixel. As can be seen in FIG. 3, the metasurface array 200 includes four pixels, i.e., pixel 210, pixel 220, pixel 230, and pixel 240. Pixel 210 includes the four-by-four array of unit cells in the upper left of the metasurface array 200 with patterned elements in a first layout. Pixel 220 includes the four-by-four array of unit cells in the lower left of the metasurface array 200 with patterned elements in a second layout. Pixel 230 includes the four-by-four array of unit cells in the upper right of the metasurface array 200 with patterned elements in a third layout, and pixel 240 includes the four-by-four array of unit cells in the lower right of the metasurface array 200 with patterned elements in a fourth layout. As shown in FIG. 3, the unit cells for the each of the pixels 210, 220, 230, and 240 have patterned elements with different layouts. As such, each of the pixels 210, 220, 230, and 240 may generate an output signal at a different wavelength. In the metasurface array 200, the unit cells of a given pixel are grouped spatially into regions for the respective pixel. However, according to some example embodiments, the unit cells of the pixels may be distributed or interleaved across the array such that, for example, no unit cell of a given pixel is disposed adjacent to another unit cell of a given pixel.

Figure 4:
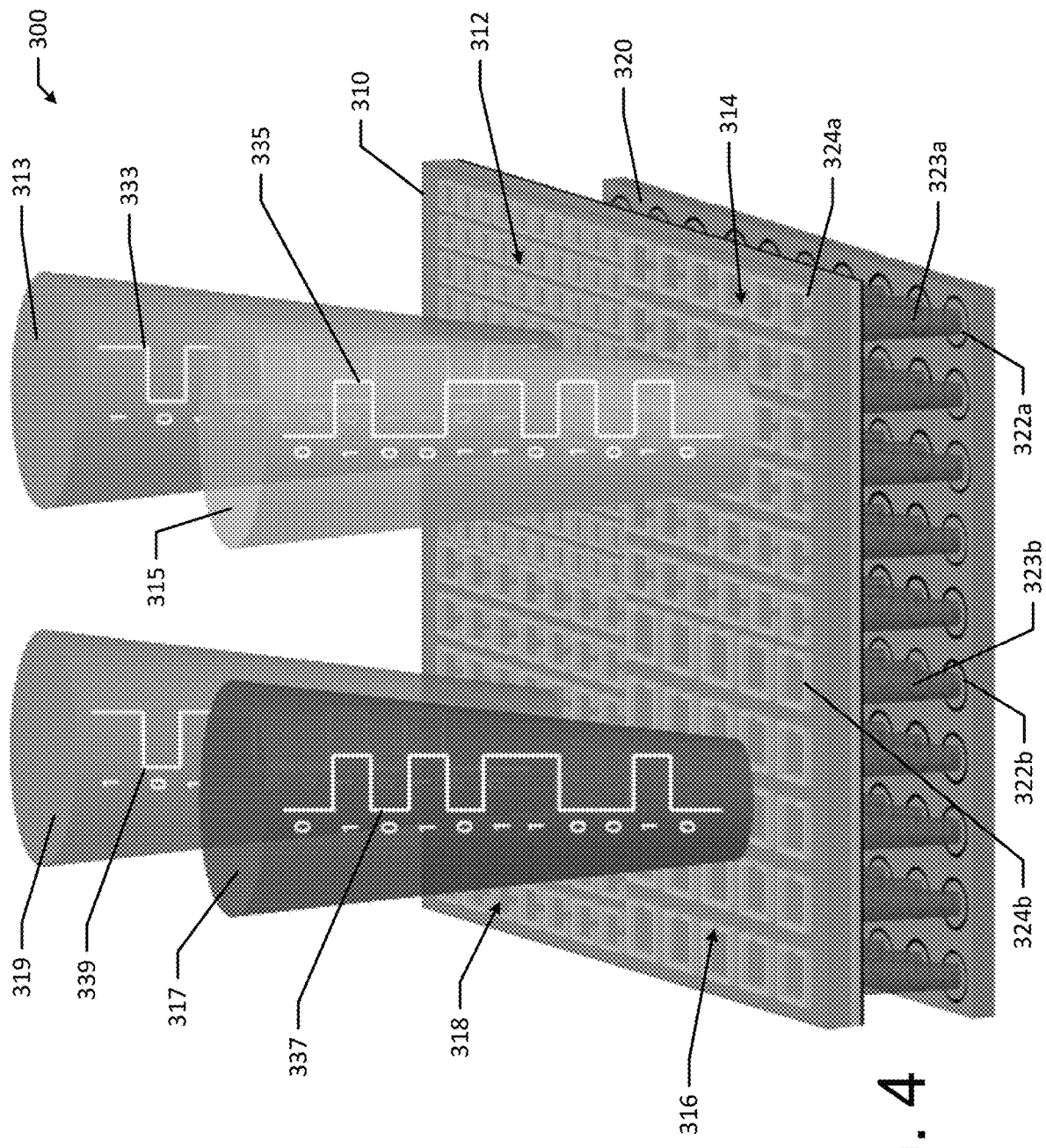
FIG. 4 illustrates a metasurface communicator according to some example embodiments according to some example embodiments.

FIG. 4 illustrates a metasurface communicator 300 comprising a metasurface array 310 and a stimulus device in the form of an optical source array 320 (e.g., a VCSEL array) that is being controlled by control circuitry (not shown) to generate output signals 313, 315, 317, and 319. Similar to metasurface array 200, the metasurface array 310 is shown as including four pixels 312, 314, 316, and 318 disposed in respective corner regions. Again, each of the patterned elements for the pixels 312, 314, 316, and 318 have the same layout. As such, each of the pixels 312, 314, 316, and 318 may generate a respective output signal 313, 315, 317, and 319 having a different wavelength.

The optical source array 320, as the stimulus device, is shown as having a plurality of optical outputs that are configured to generate respective optical signals as the stimulus media. In this regard, each unit cell of the metasurface array 300 is associated with a respective optical output of the optical source array 320. As such, an individual optical output may be controlled to cause a phase change (e.g., amorphous phase to crystalline phase or crystalline phase to amorphous phase) in the phase change material for that respective unit cell. In this regard, each optical output may be addressable and uniquely controlled to stimulate the phase change material of the respective unit cell and generate an associated output signal. As such, for example, the optical output 322a may generate laser 323a to cause a phase change in the phase change material of unit cell 324a, which is a unit cell of pixel 314. Similarly, for example, the optical output 322b may generate laser 323b to cause a phase change in the phase change material of unit cell 324b, which is a unit cell of pixel 316. As such, the optical outputs of the optical source array 320 may be controlled at the unit cell-level, since each unit cell may be individually controlled by a respective optical output. However, according to some example embodiments, the optical outputs of the optical source array 320 may be controlled as a group for a given pixel and thus, for example, all of the optical outputs for a given pixel 312, 314, 316, and 318 may be controlled to operate together.

Whether controlled at the individual unit cell-level or at the pixel-level, the unit cells of the metasurface array 300 may be controlled to generate an output signal by controlling the respective optical output. In this regard, for example, the optical output may be rapidly controlled to change from an activated state (e.g., laser on) to a deactivated state (e.g., laser off). By activating and deactivating the optical output, heating or cooling of the respective unit cell and the phase change material of the unit cell may occur, which may cause phase changes in the phase change material to form a resonator that generates an output signal. In this manner, as described above, a bit sequence may be encoded into the output signal. As shown in FIG. 4, pixel-level control may be performed to generate output signal 313 with bit sequence 333, output signal 315 with bit sequence 335, output signal 317 with bit sequence 337, and output signal 319 with bit sequence 339.

As such, the metasurface array 300 may include a plurality of first patterned elements, for example, for a pixel 312 that are disposed adjacent to the phase change material layer. The first patterned elements may have a first layout. Further, the metasurface array 300 may include a plurality of second patterned elements, for example, for a pixel 314 that are disposed adjacent to the phase change material layer. The second patterned elements may have a second layout. In response to the phase change material adjacent the first patterned elements transitioning from a first phase to a second phase, the first patterned elements may contribute to formation of a first resonator to generate a first electromagnetic signal (e.g., output signal 313) comprising a first defined wavelength. Similarly, in response to the phase change material adjacent the second patterned elements transitioning from a third phase to a fourth phase, the second patterned elements contribute to formation of a second resonator to generate a second electromagnetic signal comprising a second defined wavelength. In this regard, the first phase may be the amorphous phase or the crystalline phase and the second phase may be the other of the amorphous phase or the crystalline phase to the first phase. Similarly, the third phase may be the amorphous phase or the crystalline phase and the fourth phase may be the other of the amorphous phase or the crystalline phase to the third phase.

Now referring to FIG. 5, an example method 500 of operation of unit cell of a metasurface communicator (e.g., unit cell 100) is provided. In this regard, the example method 500 may comprise, at 510, applying a stimulus to a phase change material of a metasurface unit cell. The applied stimulus may take a variety of forms. For example, according to some example embodiments, applying the stimulus may comprise applying an optical signal, an electrical signal, or a thermal signal to the phase change material, possibly via other materials. According to some example embodiments, the stimulus may operate to change the temperature of the phase change material to facilitate a phase change of the phase change material. In this regard, according to some example embodiments, applying the stimulus may include a multiple operation process for changing the temperature of the phase change material rapidly to different temperatures to facilitate a phase change and maintain a phase condition until another change in phase is desired.

In this regard, the example method 500 may include, at 520, transitioning the phase change material from a first phase to a second phase in response to the application of the stimulus of the phase change material. In this regard, the first phase may be an amorphous phase or a crystalline phase and the second phase may be the other of the amorphous phase or the crystalline phase. As described above, a change in the temperature of the phase change material may operate to cause the phase change material to change from an amorphous state to a crystalline state, or from crystalline state to an amorphous state.

Further, the example method 500 may also include, at 530, generating an electromagnetic signal at a defined wavelength due to formation of a resonator in response to the transitioning of the phase change material from the first phase to the second phase. In this regard, the transition of the phase change material, for example, to a crystalline phase operates to change the dielectric characteristics of the phase change material. As such, the dielectric characteristics of the phase change material in the crystalline phase may support the formation of a resonance circuit or a resonator with a patterned element and a phase change material. As a result, the excited resonator may generate an electromagnetic signal with a defined wavelength and frequency. The defined wavelength and frequency may be a function of the layout of the patterned conductive material, and more specifically, the inductance and capacitance formed by the patterned conductive layer and a ground plane, where the phase change material operates as a dielectric spacer. As such, the formed resonator may comprise a patterned element and the phase change material. Further, according to some example embodiments, the metasurface unit cell may comprise the patterned element, the phase change material, and a ground plane layer, wherein the patterned element is disposed adjacent to the phase change material, and the phase change material may be disposed on a ground plane layer.

According to some example embodiments, the example method 500 may further include removing the stimulus from the phase change material, and transitioning the phase change material from the second phase to the first phase, in response to the removal of the stimulus from the phase change material. In this regard, removal of the stimulus, where, for example, removal of the stimulus may include a process involving changes to the temperature of the phase change material to transition the phase change material to the amorphous phase and maintain the phase change material in the amorphous phase. The example method 500 may further include ceasing generation of the electromagnetic signal at the defined wavelength due to transitioning the phase change material to the first phase. In this regard, the resonator may be changed or shifted (possibly temporarily) because the dielectric characteristics of the phase change material in the second phase may not support the formation of the resonator that generates the electromagnetic signal at the defined wavelength. As such, the electromagnetic signal at the defined wavelength may no longer be generated. Accordingly, through control of the stimulus, the phase of the phase change material may be controlled, which can provide for encoding digital information into the electromagnetic signal for transmission via the metasurface unit cell.

Many modifications and other embodiments of the measuring device set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. In cases where advantages, benefits or solutions to problems are described herein, it should be appreciated that such advantages, benefits and/or solutions may be applicable to some example embodiments, but not necessarily all example embodiments. Thus, any advantages, benefits or solutions described herein should not be thought of as being critical, required or essential to all embodiments or to that which is claimed herein. Although specific terms are employed herein, they are used in a generic and descriptive sense only and not for purposes of limitation.

What is claimed is:

1. A metasurface unit cell comprising:
   a ground plane layer comprising a first conductive material;
   a phase change material layer operably coupled to the ground plane layer, the phase change material layer comprising a phase change material configured to transition between an amorphous phase and a crystalline phase in response to a stimulus;
   a patterned element disposed adjacent to the phase change material layer, the patterned element comprising a second conductive material; and
   wherein, with the phase change material in a second phase, the metasurface unit cell is configured to operate as a resonator that generates an electromagnetic signal comprising a defined wavelength, wherein the defined wavelength is an infrared wavelength;
   wherein the first phase is the amorphous phase or the crystalline phase and the second phase is the other of the amorphous phase or the crystalline phase; and
   wherein with the phase change material is in the first phase, the metasurface unit cell is configured to not resonate to generate the electromagnetic signal comprising the defined wavelength.

2. The metasurface unit cell of claim 1, wherein the defined wavelength is based on a layout of the patterned element.

3. The metasurface unit cell of claim 1, wherein the stimulus comprises an optical signal, an electrical signal, or a thermal signal applied to the phase change material.

4. The metasurface unit cell of claim 1, wherein the phase change material comprises a chalcogenide glass.

5. The metasurface unit cell of claim 1, wherein the defined wavelength is in the range of about 800 nanometer to 15 micrometers.

6. The metasurface unit cell of claim 1, wherein a thickness of the metasurface unit cell is less than one micrometer.

7. The metasurface unit cell of claim 1, wherein a thickness of the phase change material layer is at least 200 times less than the defined wavelength of the electromagnetic signal.

8. The metasurface unit cell of claim 1, wherein the stimulus is provided by an element of a vertical cavity surface emitting laser (VCSEL).

9. A metasurface array comprising:
- a ground plane layer comprising a first conductive material;
- a phase change material layer operably coupled to the ground plane layer, the phase change material layer comprising a phase change material configured to transition between an amorphous phase and a crystalline phase in response to a stimulus;
- a plurality of first patterned elements disposed adjacent to the phase change material layer, the first patterned elements having a first layout; and
- a plurality of second patterned elements disposed adjacent to the phase change material layer, the second patterned elements having a second layout;
- wherein, with the phase change material adjacent the first patterned elements in a second phase, a first assembly comprising the first patterned elements, the phase change material layer, and the ground plane layer is configured to operate as a first resonator that generates a first electromagnetic signal comprising a first defined wavelength, the first defined wavelength being in the infrared spectrum;
- wherein, with the phase change material adjacent the second patterned elements in a fourth phase, a second assembly comprising the second patterned elements, the phase change material layer, and the ground plane layer is configured to operate as a second resonator that generates a second electromagnetic signal comprising a second defined wavelength, the second defined wavelength being in the infrared spectrum and the second defined wavelength being different from the first defined wavelength;
- wherein the first phase is the amorphous phase or the crystalline phase and the second phase is the other of the amorphous phase or the crystalline phase to the first phase; and
- wherein the third phase is the amorphous phase or the crystalline phase and the fourth phase is the other of the amorphous phase or the crystalline phase to the third phase.

10. The metasurface array of claim 9 wherein the plurality of first patterned elements are grouped in a first region forming a first pixel and the plurality of second patterned elements are grouped in a second region forming a second pixel.

11. The metasurface array of claim 9, wherein the first defined wavelength is based on a first layout of the first patterned elements and the second defined wavelength is based on a second layout of the first patterned elements.

12. The metasurface array of claim 9, wherein the stimulus comprises an optical signal, an electrical signal, or a thermal signal applied to the phase change material at selected locations of the metasurface array associated with the plurality of first patterned elements or the plurality of second patterned elements.

13. The metasurface array of claim 9, wherein the phase change material comprises a chalcogenide glass.

14. The metasurface array of claim 9, wherein the first defined wavelength and the second defined wavelength are in the range of about 800 nanometers to 15 micrometers.

15. The metasurface array of claim 9, wherein a thickness of the metasurface array is less than one micrometer.

16. The metasurface array of claim 9, wherein a thickness of the phase change material layer is at least 200 times less than the first defined wavelength of the first electromagnetic signal or the second defined wavelength of the second electromagnetic signal.

17. The metasurface array of claim 9, wherein the stimulus is provided by a vertical cavity surface emitting laser (VCSEL) array having an optical output for each first patterned element and each second patterned element.

18. A method comprising:
- applying a stimulus to a phase change material of a metasurface unit cell;
- transitioning the phase change material from a first phase to a second phase in response to the application of the stimulus of the phase change material, the first phase being an amorphous phase or a crystalline phase and the second phase being the other of the amorphous phase or the crystalline phase; and
- with the phase change material in the second phase to configure the metasurface unit cell to operate as a resonator at a defined wavelength, generating an electromagnetic signal at the defined wavelength, the defined wavelength being an infrared wavelength,
- wherein the metasurface unit cell comprises the patterned element, the phase change material, and a ground plane layer, wherein the patterned element is disposed adjacent to the phase change material, and the phase change material is operably coupled to the ground plane layer.

19. The method of claim 18 further comprising:
- removing the stimulus from the phase change material;
- transitioning the phase change material from the second phase to the first phase in response to the removal of the stimulus from the phase change material; and
- ceasing generation of the electromagnetic signal at the defined wavelength due to transitioning the phase change material to the first phase.

20. The method of claim 19, wherein applying the stimulus comprises applying an optical signal, an electrical signal, or a thermal signal to the phase change material.

* * * * *